United States Patent [19]

Szczyrbowski et al.

[11] Patent Number: 5,240,584
[45] Date of Patent: Aug. 31, 1993

[54] APPARATUS FOR THE REACTIVE COATING OF A SUBSTRATE

[75] Inventors: Joachim Szczyrbowski, Goldbach; Stephan Roegels, Rodenbach, both of Fed. Rep. of Germany

[73] Assignee: Leybold Aktiengesellschaft, Hanau, Fed. Rep. of Germany

[21] Appl. No.: 839,963

[22] Filed: Feb. 24, 1992

[30] Foreign Application Priority Data

Nov. 7, 1991 [DE] Fed. Rep. of Germany ....... 4136655

[51] Int. Cl.$^5$ ............................................. C23C 14/35
[52] U.S. Cl. ................................................. 204/298.08
[58] Field of Search .................................... 204/298.08

[56] References Cited

U.S. PATENT DOCUMENTS 5,126,032  6/1992  Szczyrbowski et al. ........ 204/298.08
5,126,033  6/1992  Szczyrbowski et al. ........ 204/298.08

Primary Examiner—Aaron Weisstuch
Attorney, Agent, or Firm—Felfe & Lynch

[57] ABSTRACT

In an apparatus for the reactive coating of a substrate (1) with an electrically conductive material (FIG. 1), for example with silicon dioxide ($SiO_2$), including a power source (10) which is connected with a cathode (5) disposed in an evacuable coating chamber (15, 15a) and enclosing magnets (7, 8, 9) and which cooperates electrically with a target (3) which is sputtered and whose sputtered particles deposit themselves on the substrate, two electrodes (5, 44) separated electrically from one another and from the sputtering chamber (25) are provided, the one electrode (5) being a magnetron cathode in which the cathode body (11) and the material of the target (3) are connected electrically with one another and the other electrode acts as an anode (44) in the plasma discharge, and wherein a direct-current source (10) with an electrically floating output is provided whose negative terminal is connected with the cathode (5)—with the interposition of choke (45) and resistance (46) connected parallel to the latter—and whose positive terminal is connected by the line (40) to the anode (44), and wherein, for the purpose of a stable coating process, between the cathode (5) and the anode (44) a first low-inductance, RF-compatible capacitor (34) and an inductor (49) are inserted and between anode (44) and the electrically separated vacuum chamber (25) a resistor (47) is inserted.

3 Claims, 2 Drawing Sheets

APPARATUS FOR THE REACTIVE COATING OF A SUBSTRATE

The invention relates to an apparatus for the reactive coating of a substrate, for example with silicon dioxide ($SiO_2$), comprising a current source which is connected with an electrode disposed in an evacuable coating chamber, which is electrically connected to a target that is being sputtered and whose sputtered particles precipitate on the substrate, wherein a process gas and a reactive gas are admissible into the sputter coating chamber, and two electrodes separated electrically from one another and from the sputtering chamber are provided, of which one electrode is a magnetron cathode in which the cathode body and the material of the target are electrically connected together and the other electrode acts as an anode in the plasma discharge, and wherein a direct-current supply with an electrically floating output is provided whose negative terminal is connected with the cathode with the interposition of a choke, and whose positive terminal is connected to the anode, a first resistor being disposed parallel to the choke, and wherein between the cathode and the anode a low-inductance capacitor is inserted and between anode and the ground connection a second resistor is inserted, in accordance with our U.S. Pat. No. 5,126,032. Our U.S. Pat. No. 5,126,033 is also related to this application.

In known methods for coating substrates by means of cathode sputtering and with materials with a high affinity for a reactive gas, the problem exists that, in addition to the substrate itself, parts of the apparatus, such as the inner wall of the process chamber or parts of masks, become coated with materials of little or no electrical conductivity, which necessitates the frequent changing of the process parameters during a single coating operation or the frequent cleaning or replacement of parts of the apparatus, but especially it leads to the feared electrical discharges (arcing).

It was therefore an object of the invention according to the above mentioned patents to provide an apparatus for the sputtering of materials with a high affinity for a reactive gas, which will permit a uniform, stable process free of arcing and make it unnecessary to clean the parts of the apparatus, without making the conventional or already-existing apparatus or installations unsuitable for the purpose, and without the need to perform great or expensive conversions or alterations thereof. Furthermore, the apparatus is to operate trouble-free even over long periods of time, doing so even in the reactive deposition of insulating coatings, such as $SiO_2$, $Al_2O_3$, $NiSi_2$ oxide, $ZrO_2$, $TiO_2$, $ZnO$, $Ta_2O_3$, and $SnO_2$.

In practice, it has now been found that the apparatus described in the above patents does suppress most of the arcing or shortens the duration of each arc, but that it is desirable to reduce the energy of the arcing still further or improve reignition after an arc.

This object is achieved according to the invention by inserting an inductor into the path through the resistor or choke in series with the low-inductance capacitor, in which the typical value of L is approximately 15 microhenrys.

In an alternative embodiment having a cathode with an annular or oval target, and a cathode is provided which is separated electrically from the vacuum chamber and from the anode and configured as a magnetron cathode, and comprising two parts electrically separated from one another, the target base body with yoke and magnet as one part is connected to the negative pole or terminal of a direct-current supply, with the interposition of a capacitor. The target is connected by an additional low inductance capacitor to the positive pole or terminal of the power supply and with the anode, which in turn is connected to ground with the interposition of a resistor connected in series with the latter. An additional inductor is inserted, in accordance with the invention, in series with the low-inductance capacitor, into the branch line to the resistor and to the choke. The value of the grounded resistor is typically between 2,000 and 10,000 ohms.

Further details and features are further described and specified below.

BRIEF DESCRIPTION OF THE DRAWINGS

The invention admits of a great variety of embodiments; two of them are represented diagrammatically in the appended two drawings, which show a section through sputtering apparatus with differently configured magnetron sputtering cathodes.

DETAILED DESCRIPTION OF THE DRAWINGS

Figure 1:
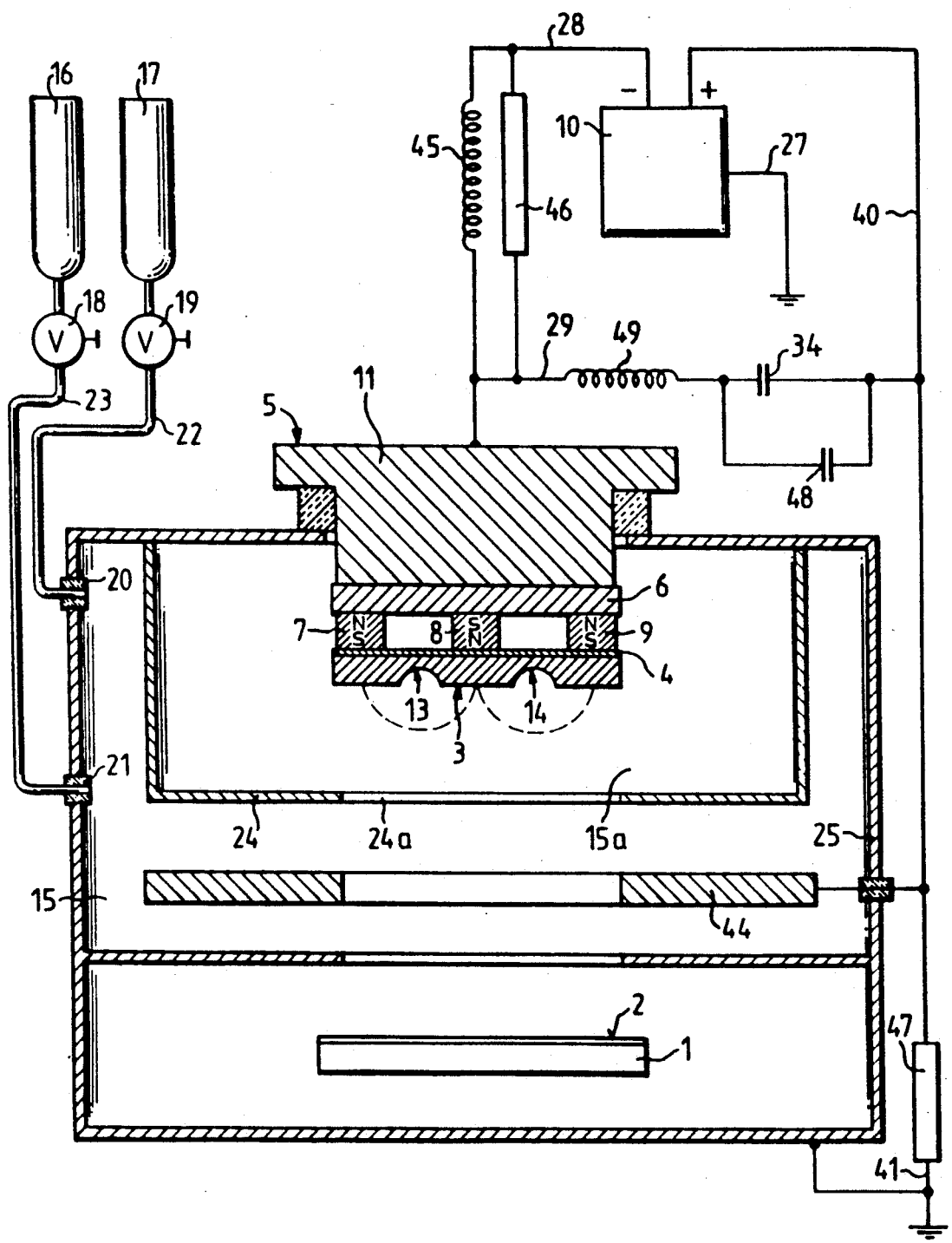

In FIG. 1 there is shown a substrate 1 which is to be provided with a thin coating 2 of an oxide (e.g., silicon dioxide or aluminum oxide). Facing this substrate 1 is a target 3 which is to be sputtered. The target 3 is connected by a plate 4 to an electrode 5 which is disposed on a yoke 6 which contains magnets 7, 8, and 9 between itself and the plate 4.

The polarities of the poles of the magnets 7, 8, and 9 facing the target 3 alternate, so that the south poles of the two outer magnets 7 and 9 produce with the north pole of the inside magnet 8 approximately arcuate magnetic fields. These magnetic fields compress the plasma in front of the target 3, so that the plasma has its greatest density at the apex of the arcs. The ions in the plasma are accelerated by an electrical field which is created by a direct-current source 10. The negative pole of this direct-current source 10 is connected by line 28 to the electrode 5, with the interposition of a choke 45 and a resistance 46 parallel with the choke. The electrical field is oriented perpendicular to the surface of the target 3 and accelerates the positive ions of the plasma toward this target 3. In this manner a more or less great number of atoms or particles are knocked out of the target, especially from the regions 13 and 14. The sputtered atoms or particles migrate mainly toward the substrate 1, where they deposit themselves as a thin coating 2.

In the apparatus according to FIG. 1, the line 28 is furthermore connected by a branch 29 and a low inductance condenser 34 inserted into the latter, and an additional condenser 48 connected parallel to condenser 34, to the line 40 which connects the positive pole of the DC source 10 to the anode 44. The DC source 10 is grounded through lead 27. Through an additional branch line 41 and a resistor 47 inserted therein the line 40 is connected to ground. The resistance of resistor 47 is typically 2000 ohms. The vacuum chamber 25 is grounded. Housing 24 having aperture 24a therein is connected to chamber 25.

The target 3 can consist, for example, of a material of great affinity for the reactive gas, such as Si, for example. During the sputtering process, this configuration and choice of material, the corresponding magnetic fields, and a tuned ratio of oxygen to argon, provide such that the coating 2 builds itself up on the substrate 1 of $SiO_2$ (silicon dioxide).

For the control of the system represented, a computer can be provided which processes the data obtained and issues controlling commands. For example, the values of the partial pressure measured in the process chamber 15 and 15a can be fed to this computer. On the basis of these and other data it can regulate the gas flow from the tanks 16 and 17 through the valves 18 and 19 and flow lines 22 and 23, extending through insulating seals 20 and 21, and adjust the voltage at the cathode 5. The process computer is also able to control all other variables, such as the cathode current and the magnetic field strength. Since such process computers are known, no description of their construction need be given.

Figure 2:
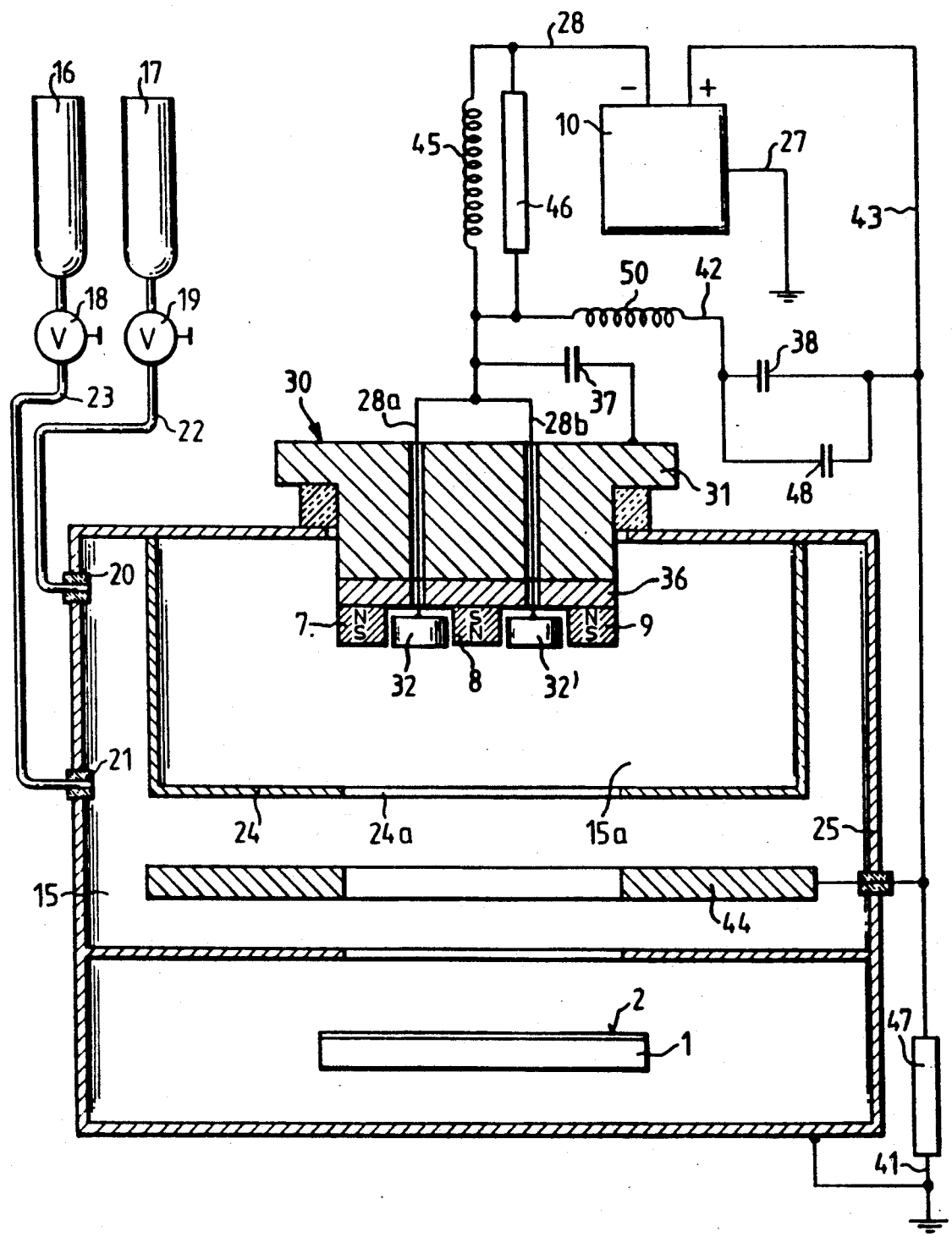

In the embodiment according to FIG. 2, the cathode 30 has an oval target 32, 32', which is connected via line 28 and branch lines 28a, 28b—with the interposition of a choke 45 and a resistor 46 placed parallel to this choke—to the negative terminal of the direct-current source 10. An additional branch line 42 with a low inductance capacitor 38 inserted therein, and an inductor 50 and an additional capacitor 48 connected parallel to this capacitor is connected to line 43 which connects the positive terminal of the DC source 10 to the anode 44, and which in turn is coupled to ground through a resistor 47 in the branch line 41.

For the accomplishment of the above-stated object, therefore, in the case of the sputtering apparatus of FIG. 1, two electrodes 5 and 44 separated electrically from one another and from the sputtering chamber 25 are provided, the one electrode being a magnetron cathode 5 and the other electrode being used as anode 44 in the plasma discharge. Furthermore, the sputtering apparatus has:

a) a direct-current power supply 10 with an electrically floating output, the negative pole of this power supply being connected through a choke 45 to the cathode 5 and its positive pole to the anode 44, and b) parallel to choke 45 a resistor 46 and c) between cathode 5 and anode 44 a low-induction, RF-rated capacitor 34 and an inductor 49, and d) between anode 44 and the electrically separate sputter chamber 25 a resistor 47.

In an alternative embodiment of a sputtering apparatus (FIG. 2), in which the cathode is constructed of two electrically separate parts, namely one part that constitutes the actual electrode (e.g., the target material 32, 32', together with the target holder) and a second part, a target surround 31, 36, (e.g., a target-between-poles cathode in which the actual target is electrically separate from yokes, magnets, and pole shoes), a low-inductance capacitor 37 is also inserted between (the oval) target 32, 32', and the electrically separate target surround 31, 36.

The purpose of the capacitor 34 or 38 is to short-circuit the radio frequency voltage and current fluctuations induced by the sputtering process, which lead to flashovers and arc discharges.

In a DC sputtering process, plasma fluctuations can develop at very high frequencies (MHz to GHz) which lead to a momentary and local voltage rise sometimes higher than the breakdown voltage of the given cathode-anode configuration. These local voltage peaks result in electrical flashovers and arcing. The capacitors 34 and 38 are intended to short-circuit these voltage peaks.

The object of the choke inductance 45 is to reduce the cathode voltage drastically during the short-circuit and thus permit the extinction of the ensuing arc.

The inductor 45, the capacitors 34 and 38, and the electrical components pertaining thereto constitute an electrical oscillator circuit. The electrical oscillation is undesirable and is therefore damped out by means of the resistor 46.

The inductor 49 and the capacitor 34 of FIG. 1 and the inductor 50 and capacitor 38 of FIG. 2 form in each case an oscillator whenever an arc forms between cathode and anode. If an arc forms, the current increases. The choke 45 (or choke 50 of FIG. 2) produces a limited or damped rise in the current. If the capacitor 34 is discharged due to the arc, the flow of current reverses.

To achieve a sputtering process that will be stable over long periods, therefore, it is essential to find ways of making it difficult or even impossible to cover the anode 44 with an insulating coating.

Lastly, the purpose of capacitor 37 consists in reducing the frequency of unanticipated electrical flashovers between the target 32, 32', and the target surround 31, or even eliminating them entirely.

Embodiment According to FIG. 1

| Standard Planar Magnetron Cathode | |
|---|---|
| Cathode length | 750 mm |
| Cathode width | 280 mm |
| LH power supply | 30 kW |
| Sizes of the Electrical Components: | |
| 45 | 1 mH |
| 46 | 100 Ω |
| 34 | 2 μF |
| 47 | 2000 Ω |
| 49 | 15 μHe |
| 48 | 20 nF |

In practice, a relatively high-capacity condenser (several μF) may lose its capacitive property at high frequencies and often has a very high inherent inductivity. The purpose of condenser 48, therefore, is to reduce its high inherent inductivity and the great inductive impedance of condenser 34 that it entails.

Embodiment According to FIG. 2

| ZPT (target-between-poles) Cathode | |
|---|---|
| Cathode length | 750 mm |
| Cathode width | 260 mm |
| LH power supply | 30 kW |
| Sizes of the Electrical Components: | |
| 45 | 1 mH |
| 46 | 100 Ω |
| 38 | 3 μF |
| 47 | 2000 Ω |
| 50 | 15 μHe |
| 48 | 20 nF |

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Apparatus for the reactive coating of a substrate with an electrically conductive material, comprising:
   an evacuable sputtering chamber;
   means for mounting said substrate in said chamber;
   a cathode disposed in the evacuable coating chamber;
   magnets disposed adjacent said cathode;
   a target electrically cooperative with said cathode and which provides sputtered particles which deposit themselves on the substrate,
   two electrodes, including said cathode, separated electrically from one another and from the sputtering chamber, said cathode being a magnetron cathode including a cathode body and said target connected electrically with one another, and the other electrode adapted to act as an anode in a plasma discharge;
   a choke;
   a direct-current power supply with an electrically floating output whose negative terminal is coupled through the choke to the cathode and whose positive terminal is coupled to the anode,
   a first resistor disposed parallel to the choke;
   a second resistor between the anode and ground; and
   a branch line between the cathode and the anode, and including, a low-inductance capacitor, and an inductor in series therewith in a branch line coupled to the resistor and to the choke, with a value of L of the order of approximately 15 μHe for the inductor.

2. Apparatus for the reactive coating of a substrate with an electrically conductive material, comprising:
   an evacuable sputtering chamber;
   means for mounting said substrate in said chamber;
   a cathode disposed in the evacuable sputtering chamber;
   magnets disposed adjacent said cathode;
   an anode being separated electrically from the sputtering chamber and from the anode, said cathode being configured as a magnetron cathode, and comprising two parts electrically separated from one another;
   a target base body and a yoke and magnets being connected as one part;
   a direct-current voltage source having a positive terminal and a negative terminal coupled through a capacitor to said one part;
   a sputtering target as the other part being coupled by a line and through a parallel connected choke and the resistor to the negative terminal of said source;
   a low inductance capacitor, the target being coupled through the low inductance capacitor to the positive terminal of the voltage source and to the anode;
   a second resistor, the anode being coupled to ground through the second resistor;
   a branch line comprising an inductor in series with the low-inductance capacitor coupled to the parallel connected resistor and choke, the value of the resistor being between in the range of approximately 2,000 ohms and approximately 10,000 ohms.

3. Apparatus for the reactive coating of a substrate with electrically insulative material, comprising;
   a D.C. power supply having a positive pole, a negative pole, and an electrically floating output;
   an evacuable coating chamber;
   means for introducing a process gas into said chamber;
   means for introducing a reactive gas into said chamber;
   a target of electrically conductive material;
   a magnetron cathode disposed in said chamber and electrically insulated therefrom, said cathode being coupled to said negative pole of said D.C. power supply via an inductor and a first resistor arranged in parallel, said cathode being arranged to attract electrically charged particles toward said target;
   an anode disposed in said chamber and electrically insulated therefrom, said anode being electrically connected to said positive pole;
   first electrical coupling means coupling said cathode to said anode and comprising a second inductor and a first capacitor in series between said cathode and said anode, and
   second electrical coupling means coupling said anode to ground and comprising a second resistor.

* * * * *